(12) United States Patent
Solf et al.

(10) Patent No.: US 8,547,100 B2
(45) Date of Patent: Oct. 1, 2013

(54) MAGNETIC RESONANCE GRADIENT COIL ISO-PLANE BACKBONE FOR RADIATION DETECTORS OF 511KEV

(75) Inventors: Torsten J. Solf, Aachen (DE); Volkmar Schulz, Wuerselen (DE); Bjoern Weissler, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 477 days.

(21) Appl. No.: 12/864,882

(22) PCT Filed: Feb. 2, 2009

(86) PCT No.: PCT/IB2009/050410
§ 371 (c)(1),
(2), (4) Date: Jul. 28, 2010

(87) PCT Pub. No.: WO2009/107005
PCT Pub. Date: Sep. 3, 2009

(65) Prior Publication Data
US 2011/0018541 A1    Jan. 27, 2011

Related U.S. Application Data

(60) Provisional application No. 61/031,024, filed on Feb. 25, 2009.

(51) Int. Cl.
*G01R 33/48* (2006.01)
(52) U.S. Cl.
USPC .................... 324/318; 324/306; 250/363.03
(58) Field of Classification Search
USPC . 324/300–322; 600/407–435; 382/128–131; 250/492.3, 363.03; 530/327
See application file for complete search history.

(56) References Cited

U.S. PATENT DOCUMENTS

| | | | |
|---|---|---|---|
| 5,389,909 A | 2/1995 | Havens | |
| 6,100,780 A | 8/2000 | Dorri et al. | |
| 6,198,957 B1 * | 3/2001 | Green | 600/411 |

(Continued)

FOREIGN PATENT DOCUMENTS

| | | |
|---|---|---|
| EP | 1642530 A1 | 4/2006 |
| JP | 2006105601 A | 4/2006 |

(Continued)

OTHER PUBLICATIONS

Peeren, G.N.; Stream function approach for determining optimal surface currents; 2003; Journal of Computational Physics; 191:305-321.

(Continued)

*Primary Examiner* — Patrick Assouad
*Assistant Examiner* — Tiffany Fetzner

(57) ABSTRACT

An imaging system comprises: a magnetic resonance scanner (30) having a cylindrical bore (36) defining a cylinder axis ($D_A$), the magnetic resonance scanner having a gradient coil (10, 10') defining an isocenter (64) within the bore and an isoplane (66) passing through the isocenter and oriented transverse to the cylinder axis; a ring of radiation detectors (60a, 60b, 60') arranged concentric with the cylindrical bore and configured to detect radiation emanating from within the bore; and a generally annular electronic circuit board (62, 62') arranged concentric with the cylindrical bore and centered on the isoplane, the generally annular electronic circuit board operatively connected with the ring of radiation detectors to generate electrical signals indicative of detection of radiation by the ring of radiation detectors.

20 Claims, 5 Drawing Sheets

(56) References Cited

U.S. PATENT DOCUMENTS

Figure 2:
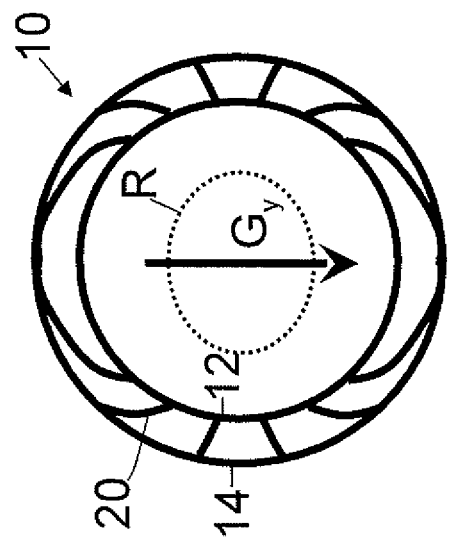

| | | | |
|---|---|---|---|
| 6,366,798 B2* | 4/2002 | Green | 600/411 |
| 6,445,182 B1* | 9/2002 | Dean et al. | 324/309 |
| 6,842,005 B2 | 1/2005 | Schuster | |
| 6,894,498 B2 | 5/2005 | Edelstein | |
| 6,930,482 B2 | 8/2005 | Heid et al. | |
| 8,188,736 B2* | 5/2012 | Schulz et al. | 324/309 |
| 8,295,905 B2* | 10/2012 | Graves et al. | 600/411 |
| 8,334,697 B2* | 12/2012 | Overweg et al. | 324/318 |
| 2001/0001807 A1* | 5/2001 | Green | 600/411 |
| 2003/0090267 A1 | 5/2003 | Rubashov | |
| 2004/0113099 A1* | 6/2004 | Eickhoff et al. | 250/492.3 |
| 2005/0082486 A1 | 4/2005 | Schlyer et al. | |
| 2006/0033496 A1 | 2/2006 | Shvartsman et al. | |
| 2006/0251312 A1 | 11/2006 | Krieg et al. | |
| 2006/0293580 A1 | 12/2006 | Ladebeck et al. | |
| 2007/0055127 A1 | 3/2007 | Ladebeck et al. | |
| 2008/0039712 A1* | 2/2008 | Graves et al. | 600/411 |
| 2009/0043189 A1* | 2/2009 | Ladebeck et al. | 600/411 |
| 2009/0048507 A1* | 2/2009 | Feiweier et al. | 600/411 |
| 2009/0299170 A1* | 12/2009 | Gebhardt et al. | 600/411 |
| 2010/0033186 A1* | 2/2010 | Overweg et al. | 324/318 |
| 2010/0102813 A1* | 4/2010 | Schulz et al. | 324/318 |
| 2011/0018541 A1* | 1/2011 | Solf et al. | 324/322 |
| 2011/0251480 A1* | 10/2011 | Graves et al. | 600/411 |
| 2011/0270078 A1* | 11/2011 | Wagenaar et al. | 600/411 |
| 2012/0077958 A1* | 3/2012 | Caravan | 530/327 |
| 2012/0206139 A1* | 8/2012 | Schulz et al. | 324/307 |
| 2012/0241631 A1* | 9/2012 | Overweg et al. | 324/322 |
| 2012/0265050 A1* | 10/2012 | Wang | 600/411 |

FOREIGN PATENT DOCUMENTS

| | | |
|---|---|---|
| WO | 03003038 A1 | 1/2003 |
| WO | 2004046745 A1 | 6/2004 |
| WO | 2005124381 A2 | 12/2005 |
| WO | 2006071922 A2 | 7/2006 |
| WO | 2006111869 A2 | 10/2006 |
| WO | 2006111883 A2 | 10/2006 |

OTHER PUBLICATIONS

Shaw, N. R., et al.; Genetic Algorithms for MRI Magnet Design; 2002; IEEE Trans. on Applied Superconductivity; 12 (1)733-736.

Lucas, A. J., et al.; Development of a combined microPET-MR system; 2006; IEEE Trans. on Nuclear Science Symposium Conference Record; pp. 2345-2348.

* cited by examiner

MAGNETIC RESONANCE GRADIENT COIL ISO-PLANE BACKBONE FOR RADIATION DETECTORS OF 511KEV

CROSS REFERENCE TO RELATED APPLICATIONS

This application claims the benefit of U.S. provisional application Ser. No. 61/031,024 filed Feb. 25, 2008, which is incorporated herein by reference.

DESCRIPTION

The following relates to the imaging arts. The following finds illustrative application to hybrid magnetic resonance scanning and positron emission tomography (PET) systems, and is described with particular reference thereto. The following finds more general application to hybrid imaging system including magnetic resonance scanning capability and any other second imaging modality that employs sensitive radiation detector electronics.

There is interest in multi-modality or hybrid scanners including both magnetic resonance (MR) and positron emission tomography (PET) capability. For example, Fiedler et al., WO 2006/111869 discloses various hybrid imaging systems. In some hybrid system embodiments disclosed in that reference, solid state PET detector elements are disposed between rungs of a whole-body birdcage coil in order to efficiently use the available cylindrical bore space. For use in an MR environment, solid state PET detectors such as scintillators coupled with solid-state silicon photomultiplier (SiPM) detectors have advantages over scintillators coupled with conventional photomultiplier tube (PMT) detectors, as discussed in WO 2006/111869.

In a conventional PET system, the PET detectors are arranged as a complete annular ring, so as to give 360° coverage of the examination region. Using less than a full annular detector ring generally results in missing data and the potential for introduction of imaging artifacts. However, the annular ring configuration of the PET detectors presents a problem for integration with an MR system, because the magnetic fields generated by the MR system can induce eddy currents in the annular PET ring.

The following provides a new and improved apparatuses and methods which overcome the above-referenced problems and others.

In accordance with one aspect, an imaging system comprises a ring of radiation detectors configured to detect radiation and a generally annular electronic circuit board disposed coaxially with the ring of radiation detectors and operatively connected with the ring of radiation detectors to generate electrical signals indicative of detection of radiation by the ring of radiation detectors.

In accordance with another aspect, an imaging system comprises: a magnetic resonance scanner having a cylindrical bore defining a cylinder axis, the magnetic resonance scanner including a magnetic field gradient coil defining an isocenter within the bore and an isoplane passing through the isocenter and oriented transverse to the cylinder axis; a ring of radiation detectors arranged concentric with the cylindrical bore and configured to detect radiation emanating from within the bore; and a generally annular electronic circuit board arranged concentric with the cylindrical bore and centered on the isoplane, the generally annular electronic circuit board operatively connected with the ring of radiation detectors to generate electrical signals indicative of detection of radiation by the ring of radiation detectors.

In accordance with another aspect, an imaging method comprises: acquiring magnetic resonance data using a cylindrical bore magnetic resonance scanner having a magnetic field gradient coil defining an isocenter and an isoplane; detecting radiation using a ring of radiation detectors; and conducting electrical signals indicative of the detected radiation along electrically conductive paths disposed in the isoplane.

One advantage resides in providing reduced eddy current in PET components of a hybrid PET/MR scanner.

Another advantage resides in providing reduced Lorentz forces on PET components of a hybrid PET/MR scanner.

Another advantage resides in providing a more compact PET/MR scanner.

Still further advantages of the present invention will be appreciated to those of ordinary skill in the art upon reading and understand the following detailed description.

Figure 1:
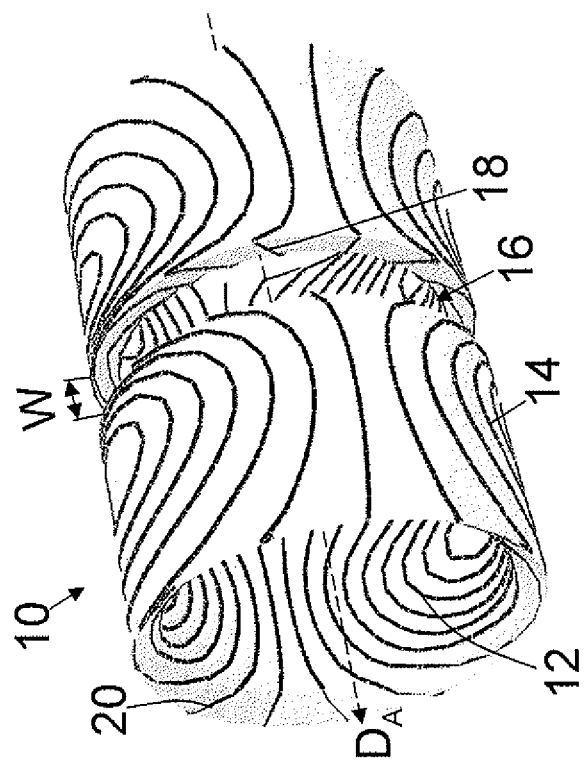

FIGS. 1 and 2 diagrammatically show perspective and end views, respectively, of an illustrative split magnetic field gradient coil.

Figure 3:
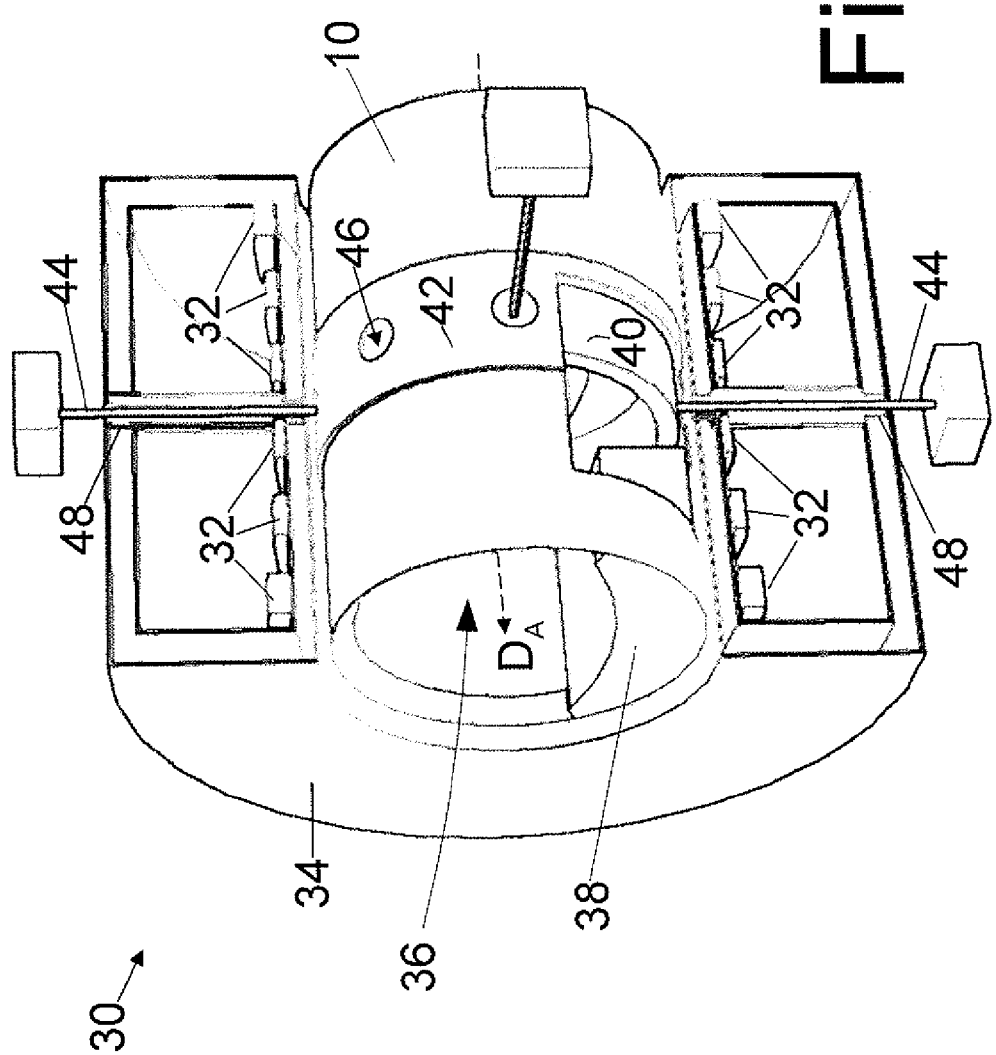

FIG. 3 diagrammatically shows a perspective view of a hybrid system having magnetic resonance (MR) scanner capability and positron emission tomography (PET) scanner capability, with the MR scanner employing the split gradient coil of FIGS. 1 and 2 and a generally annular PET detection system disposed in a central gap of the split gradient coil.

Figure 4:
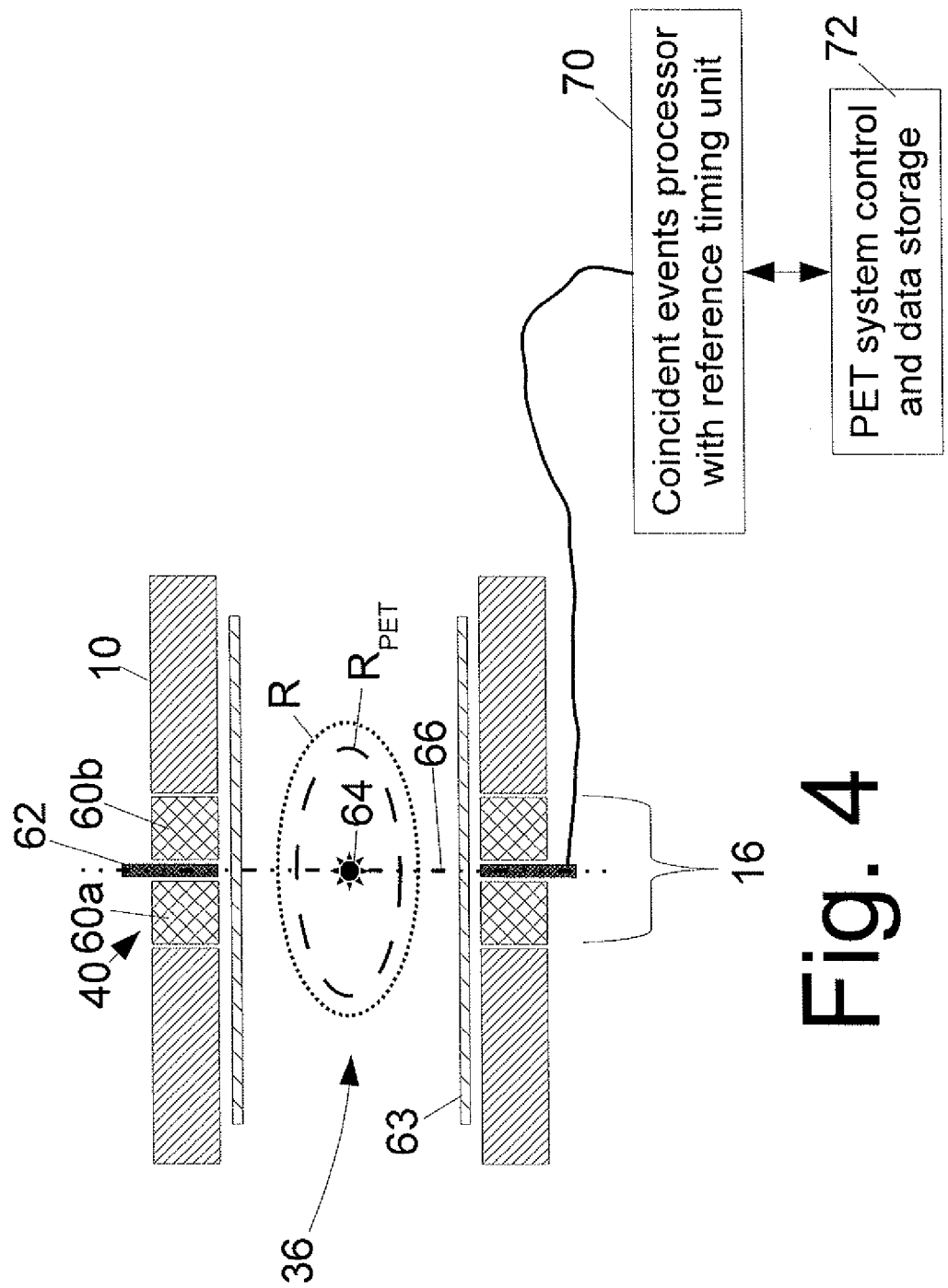

FIG. 4 diagrammatically shows a side sectional view of the gradient coil and PET detection system of the hybrid system of FIG. 3, with diagrammatic indications of the magnetic resonance and PET regions of interest, the isocenter and isoplane of the MR scanner, a whole body radio frequency coil of the MR scanner, and associated time-of-flight processing electronics.

Figure 5:
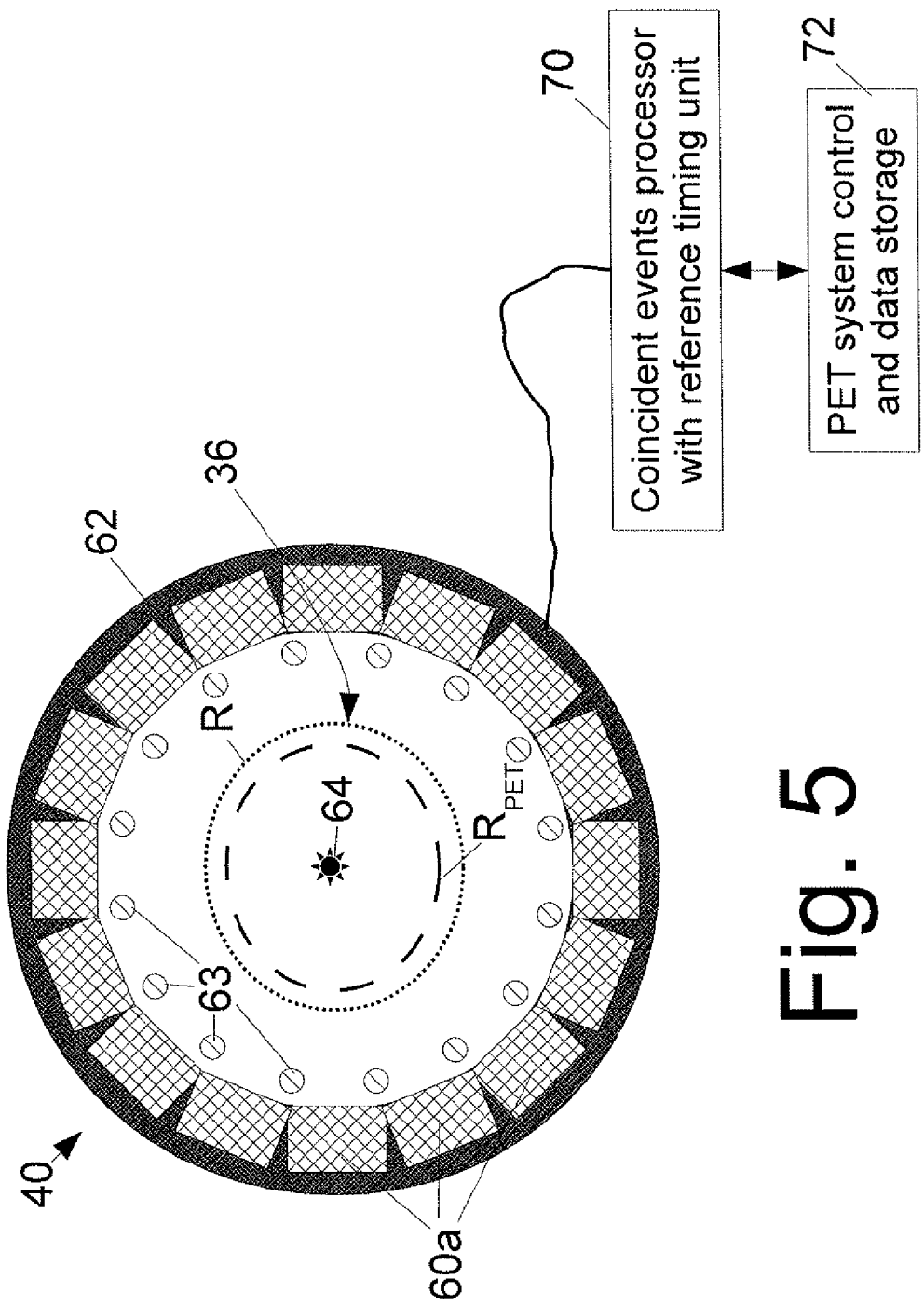

FIG. 5 diagrammatically shows an end view of the PET detection system and the whole body radio frequency coil of the hybrid system of FIG. 3, with diagrammatic indications of the magnetic resonance and PET regions of interest, the isocenter of the MR scanner, and the associated time-of-flight processing electronics.

Figure 6:
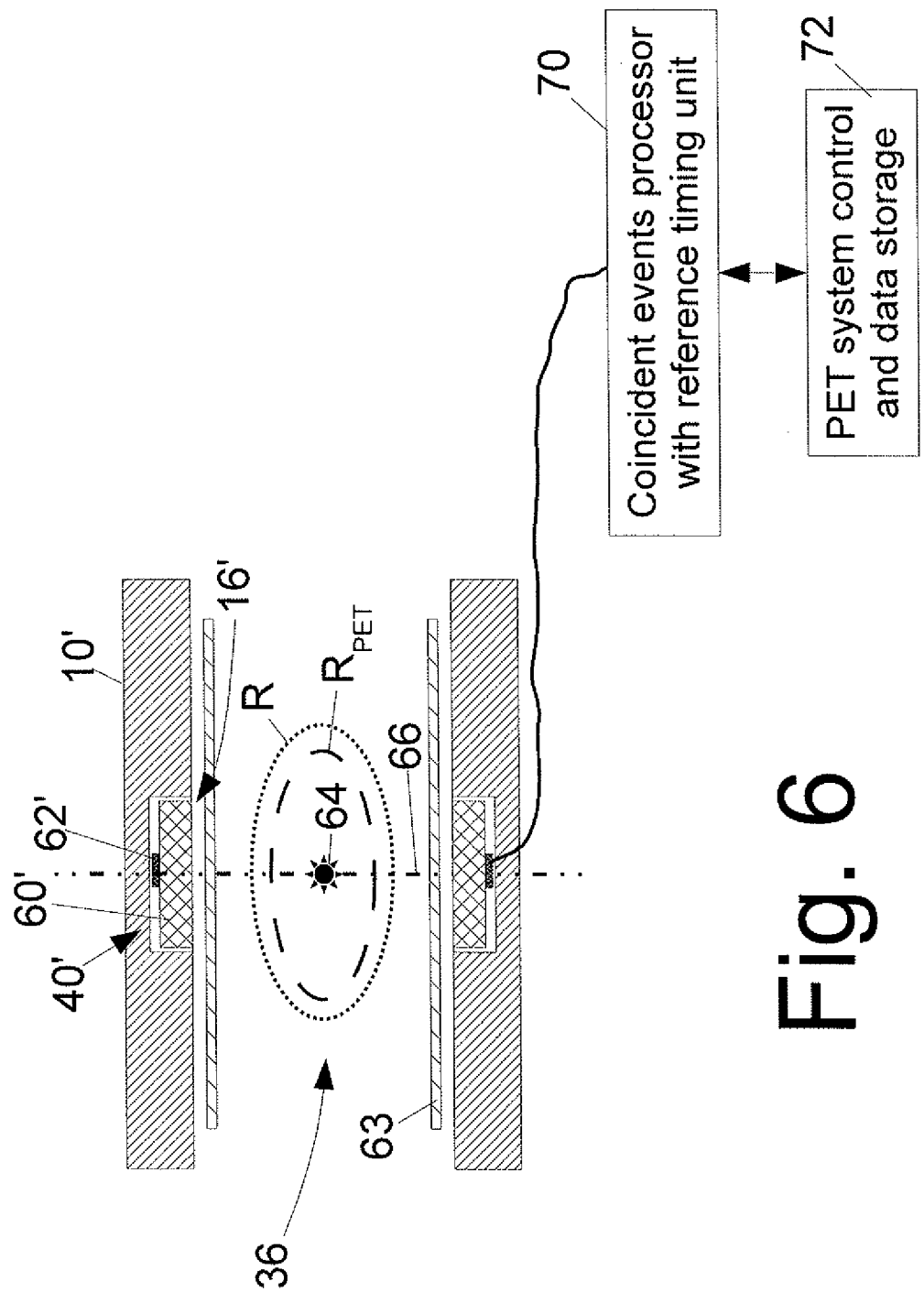

FIG. 6 diagrammatically shows a side sectional view of the gradient coil and PET detection system of a variation of the hybrid system of FIG. 3, in which the gradient coil is not split and the generally annular electronic circuit board of the generally annular PET detection system has a different configuration.

With reference to FIGS. 1 and 2, a split magnetic field gradient coil 10 is generally cylindrical with a cylinder axis $D_A$ (indicated by a dashed arrow in FIG. 1) and includes primary coil windings 12 and shield coil windings 14 at a larger radial position than the primary coil windings. The split gradient coil 10 has an annular central gap 16 that is free of coil windings. Connecting conductors 18 disposed at each edge of the central gap 16 electrically connect selected primary and secondary coil windings. The split gradient coil 10 is operable to superimpose a transverse magnetic field gradient $G_y$ on an axially oriented static magnetic field at least in a magnetic resonance region of interest R (indicated diagrammatically by a dotted boundary line in FIG. 2). A split magnetic field gradient coil for generating a transverse magnetic field gradient in the x-direction can similarly be formed by rotating the coil windings 12, 14 by 90° relative to the coil generating the $G_y$ magnetic field gradient. Connecting conductors 20 disposed at the ends of the coil windings 10 distal from the central gap 16 also electrically connect selected primary and secondary coil windings the selected windings being potentially the same as, or different from, the selected windings connected proximate to the central gap 16 by the connecting conductors 18. Some primary windings or secondary windings may be isolated windings that are not connected by any of the connecting conductors 18, 20.

The connecting conductors 20 provide a relatively larger and more uniform field of view, as disclosed for example in Shvartsman et al., U.S. Publ. Appl. 2006/0033496 A1 which is incorporated herein by reference in its entirety. The connecting conductors 18 enable non-zero current densities adjacent the central gap 16 that compensate for the lack of magnetically operative current density in the central gap 16. This compensation enables the central gap 16 to be made larger than would otherwise be possible while still maintaining acceptable coil efficiency and field quality. The central gap 16 has an axial extent W of at least ten centimeters, and more preferably at least about fifteen centimeters, and in some embodiments at least about twenty centimeters, so as to accommodate a ring of radiation detectors configured to detect 511 keV radiation. It is also contemplated to omit either one or both of the connecting conductor sets 18, 20.

The configuration of the coil windings 12, 14, 18, 20 is designed to provide good magnetic field gradient uniformity at least across the magnetic resonance region R of interest. Such design is suitably performed using a stream function approach, as described for example in Peeren, "Stream Function Approach for Determining Optimal Surface Currents", Journal of Computational Physics vol. 191 pages 305-21 (2003) and in "Stream Function Approach for Determining Optimal Surface Currents", Doctoral Thesis of Gerardus N. Peeren (Eindhoven University of Technology 2003), both of which are incorporated herein by reference in their entirety. The stream function approach determines a continuous current density distribution, represented by a stream function, that provides a specified magnetic field distribution, and then discretizes the obtained stream function to obtain the coil windings distribution.

With reference to FIG. 3, the split gradient coil 10 is supported in a magnetic resonance scanner 30 on a dielectric former or other rigid support that can accommodate the Lorentz forces that are sometimes generated between the two halves of the split gradient coil 10 during operation. The magnetic resonance scanner 30 further includes main magnet windings 32 disposed in a cryogenic housing 34 defining a main magnet producing a static axially oriented $B_0$ magnetic field in the magnetic resonance region R of interest. The magnetic resonance scanner 30 defines a cylindrical bore 36 that is concentric with the generally cylindrical split gradient coil 10 and with the main magnet windings 32, and hence the generally cylindrical components 10, 30, 32 share the common cylinder axis $D_A$. A suitable support 38 is provided to support a prone human patient or other subject in the bore 36 so as to have at least a region of interest of the subject lie within the magnetic resonance acquisition region R.

The scanner of FIG. 3 is a hybrid PET/MR scanner, and has a generally annular PET detection system 40 is disposed in the annular central gap 16 of the split gradient coil 30. The generally annular PET detection system 40 is configured to image a PET imaging region $R_{PET}$, which may be the same volume as the magnetic resonance imaging region R or, as shown in FIGS. 4-6, may be of differing size, and may also be offset translationally or of different shape. An annular brace 42 provides mechanical support for the halves of the split gradient coil 30 in the region of the gap 16. The PET detection system 40 is, in this illustrated embodiment, independently supported by mounting members 44 passing through openings 46 in the brace 42 and openings 48 in the magnet housing 34. The openings 48 are tubular openings suitably sealed to maintain vacuum and cryogenic reservoir integrity of the housing 34. Independent support of the PET detection system 40 is advantageous because the split gradient coil 10 tends to move and accelerate during operation due to Lorentz forces. Some movement of the gradient coil 10 is expected even when it is restrained by a rigid dielectric former, the brace 42, or other mechanical restraints. Such movement, if transferred to the PET detection system 40, would result in degradation of the acquired PET images.

The configuration of FIG. 3 is an illustrative example. In other contemplated embodiments, the brace 42 is omitted in favor of a continuous stiff cylindrical dielectric former unit, and the PET detection system 40 is mounted in an annular recess of the stiff former and vibrationally isolated from the stiff former by vibrational isolation mountings such as air bearings. Actively controlled vibration compensation can also be realized by multiple piezo-actuator mountings which are feedback-controlled by MEMS accelerometers. It is also contemplated to use a gradient coil that is not split and does not have the annular gap 16. In such embodiments, the generally annular PET detection system is suitably disposed at a smaller radius inside of the non-split gradient coil.

The hybrid system may include other components which are not shown for simplicity. For example, a radio frequency screen (not shown in FIG. 3) can extend into the openings 48 to provide RF isolation. Additional pass-through openings can be provided for electrical and other connections to the PET detection system 40, or such connections can be routed alongside or inside selected mounting members 44. As the pass-through openings are relatively small, they can be interspersed amongst the main magnet windings 32 so that the magnetic design of the main magnet is substantially unaffected by addition of the PET detection system 40. The magnetic resonance scanner also employs one or more radio frequency coils (not shown in FIG. 3), such coils optionally including local coils disposed in the bore 36, a generally cylindrical whole-body coil arranged concentrically with the bore 36, or a combination thereof.

With reference to FIGS. 4 and 5, the generally annular PET detection system 40 includes a ring of radiation detectors configured to image a PET imaging region $R_{PET}$. In the embodiment of FIGS. 4 and 5, the generally annular PET detection system 40 is configured as two rings of radiation detectors 60a, 60b disposed symmetrically about a disk-shaped electronic circuit board 62. The rings of radiation detectors 60a, 60b are generally full rings spanning 360°, although having some angular gaps in the rings is also contemplated. FIGS. 4 and 5 also diagrammatically illustrate a typical whole-body radio frequency coil 63, such as a whole-body quadrature birdcage or transverse electromagnetic (TEM) coil. The illustrated whole body coil 63 is disposed at a smaller radius than the gradient coil 10 and the PET detection system 40. In a suitable arrangement, axially oriented conductors of the whole body radio frequency coil 63 (diagrammatically depicted in sectional view in FIG. 5) are suitably made of conductive copper strip lines sufficiently thin to be transmissive for 511 keV radiation. In other embodiments, the whole body radio frequency coil may have a common radius with the annular PET detection system 40, and the axially oriented conductors disposed at azimuthal positions between PET detector modules. Moreover, in some embodiments the whole body radio frequency coil 63 may be omitted altogether, and a local coil such as a surface coil or coil array, local head coil, or the like used to provide both radio frequency excitation and magnetic resonance detection.

The ring of radiation detectors 60a, 60b is configured to detect 511 keV radiation as is suitable for PET imaging. Although not shown in detail, the ring of radiation detectors 60a, 60b can, for example, be a conventional configuration of a scintillation layer made of a material that generates scintillations responsive to exposure to 511 keV radiation, and an array of photomultiplier tube (PMT) detectors arranged to detect the scintillations. In other embodiments, the PMT detectors are replaced by solid state detectors such as silicon photomultiplier (SiPM) detectors or avalanche photodiode (APD) detectors configured to detect the scintillations.

The disk-shaped electronic circuit board 62 is generally annular and disposed coaxially with the ring of radiation detectors 60a, 60b and is operatively connected with the ring of radiation detectors 60a, 60b to generate electrical signals indicative of detection of 511 keV radiation by the ring of radiation detectors 60a, 60b. It is contemplated for the circuit board 62 to span an angular range of less than 360°, that is, for the generally annular circuit board 62 to have one or more angular gaps. The operative connection between the radiation detectors 60a, 60b and the circuit board 62 typically includes electrical bias connections to apply an operating voltage bias across the PMT detectors, SiPM detectors, APD detectors, or other detectors, and electrical signal connections to receive current pulses or other electrical signals from the detectors indicative of detection of 511 keV radiation.

The disk-shaped generally annular electronic circuit board 62 suitably includes PET backbone electronics such as galvanic power, bias voltage, and signal connections and electrically conductive power, bias voltage, and signal pathways, reference clock distribution pathways, synchronization circuitry, and so forth. Optionally, higher-level functions such as pulse integration and analog-to-digital conversion (ADC), time-to-digital conversion (TDC), single and coincident event processing and so forth are also integrated onto the disk-shaped generally annular electronic circuit board 62. Alternatively, some or all higher-level functionality may be disposed remotely from the annular PET detection system 40, for example being embodied by an associated computer operatively connected with the annular PET detection system by an ADC card or other suitable connecting hardware. In some embodiments, the electronic circuit board may include an electrically conductive ground plane of aluminum, copper, or another electrically conductive material. Such a ground plane optionally may provide or contribute to heat-sinking of the electronics.

The PET detection system 40 including the ring of radiation detectors 60a, 60b and the generally annular electronic circuit board 62 is disposed in the central annular gap 16 of the split gradient coil 10. The split gradient coil 10 generates magnetic field gradients along selected directions, such as along an axial or z-direction parallel with the cylinder axis $D_A$ and along x- and y-directions transverse to the axial or z-direction. The split gradient coil 10 generates such gradients by superimposing a spatially varying (typically linearly spatially varying) magnetic field on the static $B_0$ magnetic field in the magnetic resonance imaging volume R. The generated gradients also typically vary with time. The split gradient coil 10 is designed such that there is an isocenter 64, that is, a point in space at which the superimposed spatially varying and time varying magnetic field is zero regardless of the direction or intensity of the instantaneous generated magnetic field gradient. Although this is described for the split gradient coil 10, it is typical gradient design practice to have such an isocenter, regardless of whether the gradient coil is a split gradient coil or not. The isocenter 64 is typically located at the center of the magnetic resonance region of interest R that is imaged during magnetic resonance imaging, as illustrated in FIGS. 4 and 5. However, the isocenter can be located elsewhere, and in some embodiments the position of the isocenter can optionally be adjusted for a given magnetic field gradient coil by a DC adjustment of the gradient coil.

Since magnetic field gradients are in general three-dimensional in nature, for example being capable of generation along any of three Cartesian x-, y-, and z-directions, the isocenter 64 is a point in space. For a cylindrical magnetic resonance scanner such as that illustrated herein, it is also convenient to define an isoplane 66 of the gradient coil which passes through the isocenter 64 and is transverse to the axial direction or cylinder axis $D_A$. For an axial magnetic field gradient, that is, a gradient oriented along the cylinder axis $D_A$, the superimposed varying magnetic field is ideally zero in the isoplane 66, and is generally small everywhere across the isoplane 66. For a transverse magnetic field gradient, that is, a gradient oriented transverse to the cylinder axis $D_A$, the superimposed varying magnetic field is not zero in the isoplane 66 as a general rule, but is typically small at radial positions comparable to that of the gradient coil radius.

Accordingly, by configuring the generally annular electronic circuit board 62 as a disk disposed in the isoplane 66 of the gradient coil 10, as illustrated in FIG. 4, the electronic circuit board 62 is exposed to time varying magnetic fields superimposed by the gradient coil 10 of low or zero magnitude. As a result, eddy currents induced by time-varying magnetic field gradients in electrical conductors, a ground plane, or other electrically conductive elements of the generally annular electronic circuit board 62 are of low or zero magnitude. Lorentz forces on the generally annular electronic circuit board 62 due to magnetic field gradients are also low or zero.

For a typical printed circuit board having layer distances in a range of 0.2-0.3 millimeters, the potential area for induced signals is small enough that voltages induced by magnetic field gradients is less than about 10 millivolts. Large amounts of power (greater than 1 kilowatt) can be distributed within the plane by using several low resistive copper planes, for example using conventional multi-layer printed circuit board stock to manufacture the circuit board 62. The power planes can also be arranged as the outer layers of the multi-layer circuit board so as to provide shielding for more sensitive high-speed signaling layers that are arranged as interior layers.

Although the generally annular electronic circuit board 62 is shown in FIG. 5 as a continuous annulus, it is contemplated to introduce one or more breaks or gaps into the generally annular electronic circuit board 62, or into electrically conductive pathways of the generally annular electronic circuit board 62, in order to further suppress eddy current formation. In some embodiments, circuitry of the electronic circuit board 62 does not define any complete annular conductive paths coextensive with the circumference of the generally annular electronic circuit board 62 or around the bore 36.

Another advantage of using the generally annular electronic circuit board 62 as the backbone for the annular PET detection system 40, as compared with using flexible electrically conductive cabling for the backbone, is that the circuitry of the generally annular electronic circuit board 62 has rigid and fixed path lengths. The signals from the generally annular PET system 40 are input to a coincident events processor with reference timing unit 70. The rigid and fixed paths of the electronic circuit board 62 advantageously allow determination of precise relative timing of radiation detection events so as to detect substantially coincident 511 keV radiation detection events indicative of an electron-positron annihilation event. The unit 70 incorporates or accesses an optional time-of-flight processor if the PET system is to perform time-of-flight localization. In such time-of-flight PET, a time-of-flight difference between two substantially coincident 511 keV radiation detection events is used to further localize the electron-positron annihilation event in space. Such time-of-flight processing entails precise determination of relative detection event times, which is facilitated by the precise electrical signal transmission delay defined by the electronic circuit board 62. In contrast, flexible cabling can result in path lengths that vary in orientation or length, leading to less accurate time-of-flight processing or inclusion of optical synchronization which increases PET system complexity and cost. The time-of-flight processing generates time-of-flight PET data each comprising substantially coincident 511 keV detection events defining a line of response, with some localization along the line of response provided by the time-of-flight information. In conventional PET with no time-of-flight processing, the electron-positron annihilation event is localized only to the line of response. For conventional PET the rigid and fixed path lengths provided by the electronic circuit board 62 still ensure well-defined electronic signal transmission delays, which provide robust time windowing to identify subtantially coincident 511 keV detection events. The PET data (either conventional or time-of-flight localized) is suitably stored in a PET system control and data storage unit 72 and reconstructed using a suitable reconstruction algorithm such as filtered backprojection, iterative backprojection, or so forth.

With reference to FIG. 6, the benefit of the disk-shaped generally annular electronic circuit board 62 can also be approximately realized by otherwise-shaped generally annular electronic circuit boards that are positioned close to the isoplane 66. In the embodiment of FIG. 6, a modified gradient coil 10' is not split, but rather has a groove 16' to receive a modified generally annular PET detection system 40'. The groove 16' is not amenable to a large radial span of the disk-shaped electronic circuit board 62. Accordingly, a generally annular electronic circuit board 62' is everywhere locally oriented transverse to a plane of the ring of radiation detectors, that is, to the isoplane 66 of the gradient coil 10' for the hybrid scanner arrangement of FIG. 6, and is disposed at a larger annular radius than a modified ring of radiation detectors 60'. The generally annular electronic circuit board 62' is configured to have a small extent transverse to a plane of the ring of radiation detectors so as to be kept close to the isoplane 66.

Although not illustrated, a generally annular electronic circuit board which is a combination of the disk-shaped generally annular electronic circuit board 62 and the transversely oriented generally annular circuit board 62' is also contemplated. Although not illustrated, the annular circuit board 62 can be realized by only partially splitting the PET detector 60 (preferably from the outer side) into 60a and 60b which remain physically connected. In such an arrangement, bus conductors and other conductors of extended length or which form conductive paths substantially coextensive with the annulus of the circuit board are preferably disposed on the disk-shaped board portion 60 which has the least time-varying magnetic field exposure. The transversely oriented circuit board portion 62' is in these embodiments preferably used for shorter electrical conductor lengths such as conductors electrically connecting PMT, SiPM, APD, or other detectors with the proximate portions of the bias and signal buses located on the disk-shaped board portion 60.

Similarly, if the transversely oriented generally annular circuit board 62' is used alone, as shown in FIG. 6, then the bus conductors and other conductors of extended length or which form conductive paths substantially coextensive with the annulus of the circuit board are preferably placed on the circuit board 62' as close as practicable to the isoplane 66 of the gradient coil 10', so as to have the least time-varying magnetic field exposure.

Although a hybrid PET/MR system has been described, the disclosed PET backbone configurations are also suitably employed in stand-alone PET scanners, in PET/SPECT (single photon emission computed tomography) systems, and so forth. Moreover, it is contemplated to integrate other radiation detectors besides PET detectors with an MR system. For example, the ring of radiation detectors 60a, 60b, 60' can be replaced by a ring comprising a plurality of radiation detectors for single photon emission computed tomography (SPECT) imaging. In such embodiments, the radiation detectors are typically configured to detect radiation which may be different from 511 keV. For SPECT/MR, the ring of radiation detectors in some embodiments may be configured as movable radiation detector heads capable of moving along the ring (e.g., moving along the annular gap 16 of the split gradient coil 10, or along the groove 16' of the gradient coil 10'), similar to the radiation detector heads configuration used in some gamma cameras. Such SPECT/MR systems can readily utilize the disclosed backbone configurations 62, 62' illustratively disclosed herein with respect to the illustrative PET system 40.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. An imaging system comprising:
   a ring of radiation detectors;
   a generally annular electronic circuit board disposed coaxially with the ring of radiation detectors and operatively connected with the ring of radiation detectors in order to generate electrical signals indicative of a detection of radiation by the ring of radiation detectors, wherein the ring of radiation detectors and the generally annular electronic circuit board are configured to detect 511 keV radiation indicative of positron-electron annihilation events; and
   a magnetic resonance scanner, the generally annular electronic circuit board being disposed intersecting an isoplane of a magnetic field gradient coil of the magnetic resonance scanner.

2. The imaging system as set forth in claim 1, wherein the generally annular electronic circuit board is disposed at a larger radius than the ring of radiation detectors, and a plane of the generally annular electronic circuit board is everywhere locally oriented transverse to a plane of the ring of radiation detectors.

3. The imaging system as set forth in claim 1, wherein the generally annular electronic circuit board spans an angular range of less than 360°.

4. The imaging system as set forth in claim 1, wherein the generally annular electronic circuit board is disk-shaped and is disposed in the isoplane of the gradient coil.

5. The imaging system as set forth in claim 4, wherein the ring of radiation detectors comprise two rings of radiation detectors disposed symmetrically about the disk-shaped generally annular electronic circuit board.

6. The imaging system as set forth in claim 4, wherein the generally annular electronic circuit board spans a radial range that at least partially overlaps a radial range spanned by the ring of radiation detectors.

7. The imaging system as set forth in claim 1, wherein the generally annular electronic circuit board comprises:
a disk portion lying in the isoplane of the gradient coil.

8. The imaging system as set forth in claim 7, wherein the generally annular electronic circuit board comprises:
a transverse portion centered on the isoplane of the gradient coil and oriented transverse to the disk portion.

9. The imaging system as set forth in claim 1, wherein circuitry of the generally annular electronic circuit board does not define any complete annular conductive paths that are coextensive with the circumference of the generally annular electronic circuit board.

10. The imaging system as set forth in claim 1, wherein the gradient coil of the magnetic resonance scanner comprises:
a split gradient coil having an annular gap centered at the isoplane, the ring of radiation detectors and the generally annular electronic circuit board being disposed in the annular gap of the split gradient coil.

11. The imaging system as set forth in claim 1, wherein the gradient coil of the magnetic resonance scanner comprises:
a gradient coil having an annular groove centered at the isoplane and receiving the ring of radiation detectors and the generally annular electronic circuit board.

12. The imaging system as set forth in claim 1, further comprising:
a processor configured to identify a time-of-flight difference between two substantially coincident 511 keV radiation detection events, the processor accounting for an electrical signal transmission delay defined by the generally annular electronic circuit board.

13. An imaging system comprising:
a magnetic resonance scanner having a cylindrical bore defining a cylinder axis, the magnetic resonance scanner including:
a magnetic field gradient coil defining an isocenter within the bore; and
an isoplane passing through the isocenter and oriented transverse to the cylinder axis;
a ring of radiation detectors arranged concentric with the cylindrical bore and configured to detect radiation emanating from within the bore; and
a generally annular electronic circuit board arranged concentric with the cylindrical bore and centered on the isoplane, the generally annular electronic circuit board operatively connected with the ring of radiation detectors in order to generate electrical signals indicative of a detection of 511 keV radiation indicative of positron-electron annihilation events by the ring of radiation detectors.

14. The imaging system as set forth in claim 13, wherein the generally annular electronic circuit board comprises:
an annular disk in the isoplane of the magnetic field gradient coil.

15. The imaging system as set forth in claim 13, wherein the generally annular electronic circuit board is disposed at a radius larger than a maximum radius of the ring of radiation detectors.

16. The imaging system as set forth in claim 13, wherein the generally annular electronic circuit board defines an annular disk lying in the isoplane, and the ring of radiation detectors comprise two rings of radiation detectors disposed symmetrically about the isoplane.

17. The imaging system as set forth in claim 16, wherein the gradient coil of the magnetic resonance scanner comprises:
a split gradient coil arranged concentrically with the cylindrical bore, the ring of radiation detectors and the generally annular electronic circuit board being disposed in an annular gap of the split gradient coil.

18. The imaging system as set forth in claim 13, wherein the gradient coil of the magnetic resonance scanner comprises:
a gradient coil arranged concentrically with the cylindrical bore,
the gradient coil having an annular groove centered on the isoplane and configured for receiving the ring of radiation detectors as well as the generally annular electronic circuit board.

19. An imaging method comprising:
acquiring magnetic resonance data using a cylindrical bore magnetic resonance scanner having a gradient coil defining an isocenter and an isoplane;
detecting 511 keV radiation indicative of positron-electron annihilation events using a ring of radiation detectors; and
conducting electrical signals indicative of the detected radiation along electrically conductive paths disposed in the isoplane.

20. The imaging method as set forth in claim 19, further comprising:
distributing electrical power to the ring of radiation detectors along electrically conductive paths disposed in the isoplane.

* * * * *